(12) United States Patent
Lee et al.

(10) Patent No.: US 9,329,421 B2
(45) Date of Patent: May 3, 2016

(54) DISPLAY SUBSTRATE, METHOD OF MANUFACTURING THE SAME AND METHOD OF MANUFACTURING DISPLAY PANEL

(71) Applicant: Samsung Display Co., Ltd., Yongin (KR)

(72) Inventors: Jun-Hyup Lee, Seoul (KR); Jae-Jin Lyu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 327 days.

(21) Appl. No.: 13/747,985

(22) Filed: Jan. 23, 2013

(65) Prior Publication Data

US 2013/0128197 A1  May 23, 2013

Related U.S. Application Data

(62) Division of application No. 12/782,986, filed on May 19, 2010, now Pat. No. 8,377,614.

(30) Foreign Application Priority Data

Oct. 27, 2009  (KR) .................... 10-2009-0102083

(51) Int. Cl.
*G02F 1/1335* (2006.01)
*G02F 1/1333* (2006.01)
(Continued)

(52) U.S. Cl.
CPC .......... *G02F 1/133345* (2013.01); *G02B 5/201* (2013.01); *G02F 1/13394* (2013.01); *G02F 2001/136222* (2013.01); *G02F 2001/136236* (2013.01)

(58) Field of Classification Search
None
See application file for complete search history.

(56) References Cited

U.S. PATENT DOCUMENTS 5,933,208 A * 8/1999 Kim .................. G02F 1/133516
349/104
7,755,710 B2 * 7/2010 Wang et al. ..................... 349/48
(Continued)

FOREIGN PATENT DOCUMENTS

KR  10-0209277  7/1999
KR  10-2007-0068772  7/2007
(Continued)

OTHER PUBLICATIONS

Non-Final Office Action of U.S. Appl. No. 12/782,986 issued on Aug. 30, 2012.
(Continued)

*Primary Examiner* — Richard Kim
(74) *Attorney, Agent, or Firm* — H.C. Park & Associates, PLC

(57) ABSTRACT

In a method of manufacturing a display substrate and a method of manufacturing a display panel, the display substrate includes a color filter layer disposed on a base substrate within a pixel area, a first organic insulating pattern disposed on a first boundary area between adjacent pixel areas, a pixel electrode disposed on the color filter layer, and a first blocking pattern disposed on the first organic insulating pattern. Accordingly, an organic insulating layer corresponding to the pixel area is removed so that deterioration of the display quality by impurities generated from the organic insulating layer may be minimized. In addition, a stepped portion of a blocking pattern disposed between a pixel area and a boundary area of a plurality of the pixel areas is reduced so that motion blurring of a liquid crystal may be prevented.

17 Claims, 13 Drawing Sheets

(51) Int. Cl.
*G02B 5/20* (2006.01)
*G02F 1/1339* (2006.01)
*G02F 1/1362* (2006.01)

(56) References Cited

U.S. PATENT DOCUMENTS

| | | | |
|---|---|---|---|
| 2005/0018097 A1* | 1/2005 | Kwon | G02F 1/136227 349/43 |
| 2005/0219433 A1 | 10/2005 | Oh et al. | |
| 2005/0253984 A1 | 11/2005 | Kim et al. | |
| 2008/0030659 A1* | 2/2008 | Hu | 349/106 |
| 2008/0068537 A1* | 3/2008 | Lee et al. | 349/106 |
| 2008/0266503 A1 | 10/2008 | Lyu | |
| 2009/0115947 A1* | 5/2009 | Huang et al. | 349/106 |
| 2011/0049519 A1 | 3/2011 | Kim et al. | |

FOREIGN PATENT DOCUMENTS

| | | |
|---|---|---|
| KR | 10-2007-0081303 | 8/2007 |
| KR | 10-2009-0060625 | 6/2009 |

OTHER PUBLICATIONS

Notice of Allowance of U.S. Appl. No. 12/782,986 issued on Nov. 2, 2012.

Grant of Patent issued on Mar. 4, 2016, in Korean Patent Application No. 10-2009-0102083.

\* cited by examiner

130 STL 125 GL1   GL2              135 130

130 STL 125 GL1   GL2              130

DISPLAY SUBSTRATE, METHOD OF MANUFACTURING THE SAME AND METHOD OF MANUFACTURING DISPLAY PANEL

CROSS REFERENCE TO RELATED APPLICATIONS

This application is a divisional of U.S. patent application Ser. No. 12/782,986, filed on May 19, 2010 and claims priority from and the benefit of Korean Patent Application No. 10-2009-0102083, filed on Oct. 27, 2009, which are both hereby incorporated by reference for all purposes as if fully set forth herein.

BACKGROUND OF THE INVENTION

1. Field

Exemplary embodiments of the present invention relate to a display substrate, a method of manufacturing the display substrate, and a method of manufacturing a display panel. More particularly, exemplary embodiments of the present invention relate to a display substrate is improving display quality, a method of manufacturing the display substrate, and a method of manufacturing a display panel.

2. Discussion of the Background

Generally, a liquid crystal display device includes a liquid crystal display panel displaying an image by using the light transmittance of a liquid crystal layer and a backlight assembly disposed under the liquid crystal display panel to provide the liquid crystal display panel with light. The liquid crystal display panel includes an array substrate, a color filter substrate facing the array substrate and a liquid crystal layer interposed between the array substrate and the color filter substrate.

Recently, a color filter on array (COA) structure and a black matrix on array (BOA) structure have been reported. In the COA structure, a color filter is formed on the array substrate. In the BOA structure, a color filter and a black matrix are formed on the array substrate. According to the COA structure or the BOA structure, it is not required to consider an alignment margin for an upper substrate so an aperture ratio of a pixel may be increased. Moreover, a structure of the upper substrate is simple so that manufacturing costs may be reduced.

Recently, a low-dielectric organic thin film is used as a protecting layer or an insulating layer of a thin-film transistor for the liquid crystal display device, so that image quality and an aperture ratio may be improved by reducing parasitic capacitance. However, since the color filter or the black matrix is formed on the array substrate, a stepped portion between the color filter and the black matrix causes a motion blur malfunction of a liquid crystal display. In addition, when an organic insulating layer is exposed to ultraviolet (UV) radiation, impurities (for example, gases that are generated from the decomposition of the organic insulating layer) may cause display quality deterioration.

SUMMARY OF THE INVENTION

Exemplary embodiments of the present invention provide a substrate for improving display quality.

Exemplary embodiments of the present invention also provide a substrate having an organic insulating layer corresponding to a pixel area that is removed to minimize deterioration of display quality by impurities generated from the organic insulating layer. In addition, a stepped portion of a blocking pattern formed between a pixel area and a boundary area of a plurality of the pixel areas is reduced so that motion blurring of a liquid crystal may be prevented.

Additional features of the invention will be set forth in the description which follows, and in part will be apparent from the description, or may be learned by practice of the invention.

An exemplary embodiment of the present invention discloses a display substrate comprising a color filter layer disposed on a substrate and within a pixel area; a first organic insulating pattern disposed on the substrate in a position corresponding to a first boundary area between adjacent pixel areas; a pixel electrode disposed on the color filter layer; and a first blocking pattern disposed on the first organic insulating pattern.

An exemplary embodiment of the present invention also discloses a method of manufacturing a display substrate that comprises forming a color filter layer on a substrate and within a pixel area, the substrate comprising a switching element; forming an organic insulating layer on the substrate comprising the color filter layer; forming a first organic insulating pattern by removing the organic insulating layer from an area corresponding to the color filter layer and removing a partial thickness of the organic insulating layer from a first boundary area in the pixel area; forming a pixel electrode on the substrate, the pixel electrode being electrically connected to the switching element; forming a first blocking pattern on the first organic insulating pattern; and forming a column spacer on the color filter layer.

An exemplary embodiment of the present invention further discloses a method of manufacturing a display panel that comprises providing a first substrate. The first substrate comprises a color filter layer disposed on the first substrate and within a pixel area, the first substrate comprising a switching element; an organic insulating layer disposed on the color filter layer; a pixel electrode electrically connected to the switching element; and a first blocking pattern disposed in a boundary area between adjacent pixel electrodes. The method further comprises providing a second substrate comprising a common electrode disposed on a second base substrate; interposing a liquid crystal composition between the first substrate and the second substrate; and irradiating the first substrate and the second substrate with light to form a first reactive mesogen layer on the first substrate and a second reactive mesogen layer on the second substrate, wherein the liquid crystal composition comprises a reactive mesogen comprising at least one compound selected from the group consisting of

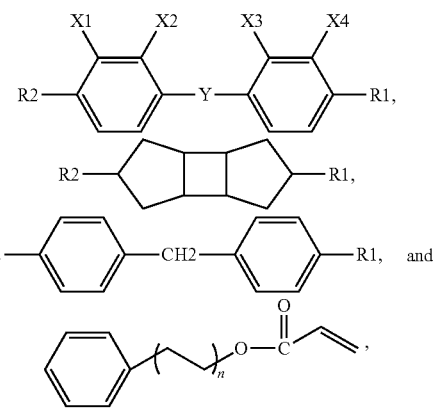

wherein R1 and R2 independently represent an acrylate group, a vinyl group, or an epoxy group; Y represents —(CH2)-, —O—, —CO—, —C(CF3)2-, or a single bond; X1, X2, X3, and X4 independently represent H or F; and n represents an integer ranging from 0 to 2.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
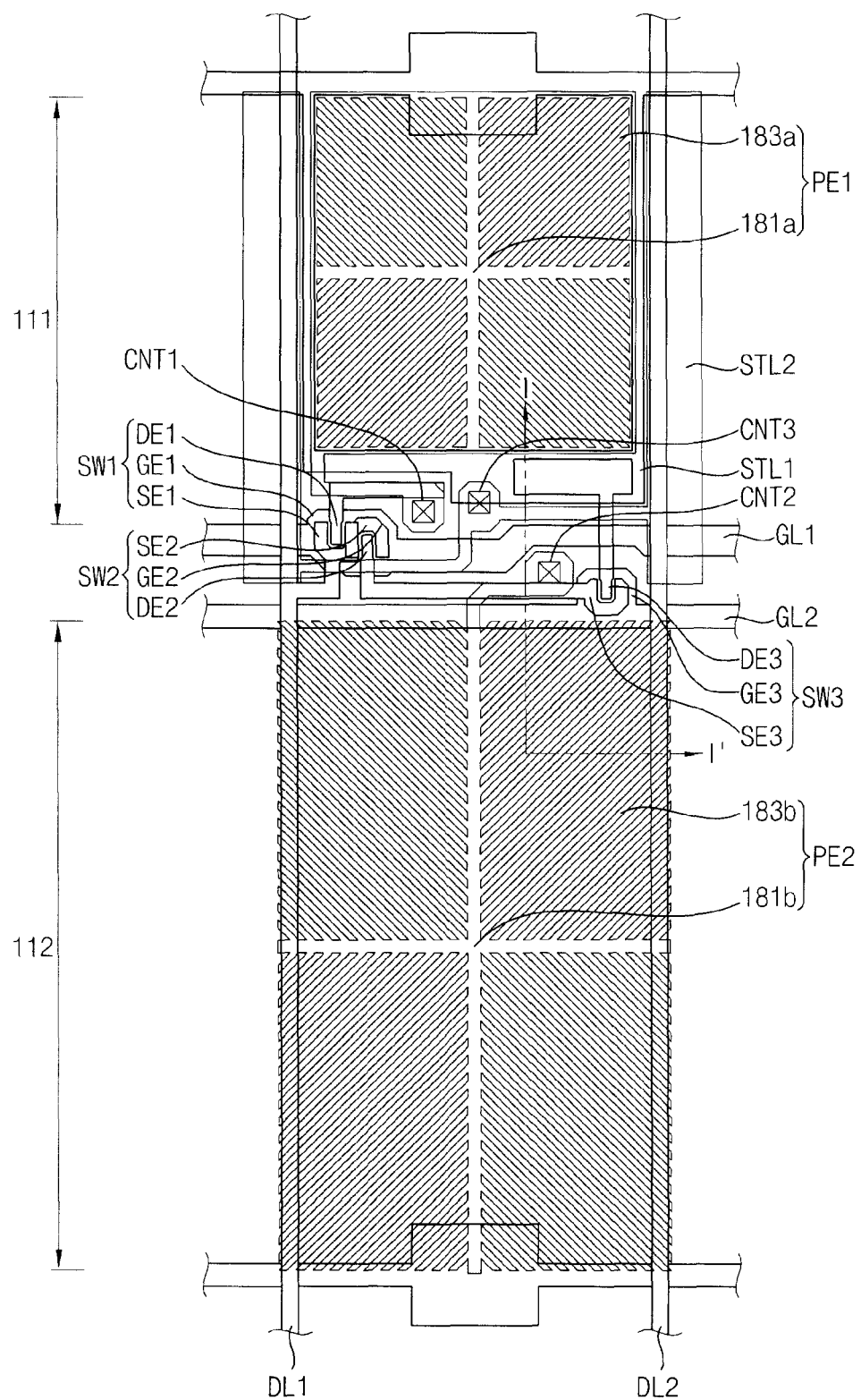
FIG. 1 is a plan view showing a display panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
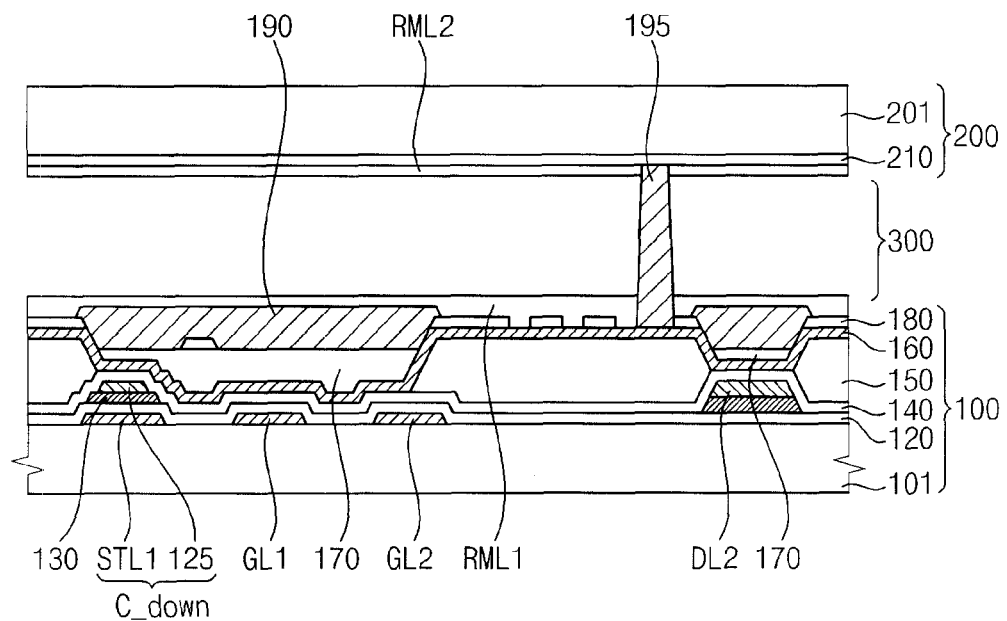
FIG. 2 is a cross-sectional view taken along a line I-I' of the display panel of FIG. 1.

FIG. 1 is a plan view showing a display panel according to an exemplary embodiment of the present invention. FIG. 2 is a cross-sectional view taken along a line I-I' of the display panel of FIG. 1. Referring to FIGS. 1 and 2, the display panel includes a first substrate 100, a second substrate 200, and a liquid crystal layer 300.

The first substrate 100 includes a gate line GLn, a data line DLm, a storage line STL, a first switching element SW1, a second switching element SW2, a third switching element SW3, a gate insulating layer 120, an active layer 130, a passivation layer 140, a color filter layer 150, an inorganic insulating layer 160, an organic insulating pattern 170, a pixel electrode, a blocking pattern 190, and a column spacer 195; all of which are formed on a first base substrate 101.

A first gate line GL1 and a second gate line GL2 are extended in a first direction. The second gate line GL2 is disposed adjacent to the first gate line GL1. The first data line DL1 and the second data line DL2 are extended in a second direction crossing the first direction. The second data line DL2 is disposed adjacent to the first data line LD1.

The first switching element SW1 is adjacent to an area where the first gate line GL1 and the first data line DL1 cross. A pixel area includes a first sub-pixel area 111 and a second sub-pixel area 112. The first switching element SW1 is disposed on a boundary area between a first pixel area and a second pixel area. A first gate electrode GE1 of the first switching element SW1 is connected to the first gate line GL1. A first source electrode SE1 is connected to the first data line DL1. A first sub-pixel electrode PE1 is electrically connected to a is first drain electrode DE1 through a first contact hole CNT1.

The second switching element SW2 is adjacent to an area where the first gate line GL1 and the first data line DL1 cross. The first switching element SW1 is disposed on a boundary area between the first sub-pixel area 111 and the second sub-pixel area 112. A second gate electrode GE2 is connected to the first gate lines GL1. A second source electrode SE2 of the second switching element SW2 is connected to the first data line DL1 and the first source electrode SE1. A second sub-pixel electrode PE2 is electrically connected to a second drain electrode DE2 through a second contact hole CNT2. The second sub-pixel electrode PE2 is disposed on a second sub-pixel area 112 adjacent to the first sub-pixel area 111.

The third switching element SW3 is disposed adjacent to an area where the second gate line GL2 and the second data line DL2 cross. The third switching element SW3 is disposed on a boundary area between the first sub-pixel area 111 and the second sub-pixel area 112. A third gate electrode GE3 of the third switching element SW3 is connected to the second gate line GL2. A third source electrode SE3 is connected to the first data line DL1 and the second drain electrode DE2. A third drain electrode DE3 is connected to the storage line STL.

A first storage line STL1 partially overlaps with the first sub-pixel electrode PE1, and surrounds the first sub-pixel area 111. A second storage line STL2 overlaps with the first and second data lines DL1 and DL2. The second storage line STL2 is electrically connected to the first storage line STL1 through a third contact hole CNT3.

The gate insulating layer 120 and the passivation layer 140 are disposed between the first sub-pixel electrode PE1 and the first storage line STL1.

The third drain electrode DE3 of the third switching element SW3 is connected to a first electrode 125 of a down capacitor Cdown. The first electrode 125 overlaps with the first storage line STL1. The first storage line STL1 may be defined as a second electrode of the down capacitor Cdown.

The first switching element SW1 and the second switching element SW2 are turned on in response to a first gate signal applied to the first gate line GL1. The third switching element SW3 is turned on in response to a second gate signal applied to the second gate line GL2. When the third switching element SW3 is turned on, a data voltage charged through the second sub-pixel electrode is lowered by the down capacitor Cdown. An area having the first sub-pixel electrode PE1 may be defined as a high pixel HP of the display panel. An area having the second sub-pixel electrode PE2 may be defined as a low pixel LP of the display panel.

The first sub-pixel electrode PE1 includes a first micro electrode 183a. The first micro electrodes 183a may be branched from a first body portion 181a that is extended in a first direction and a second direction in a cross shape. The first micro electrodes 183 have a radial shape. The second sub-pixel electrode PE2 includes a second micro electrode 183b. The second micro electrodes 183b may be branched from a second body portion 181b having a cross shape. The second micro electrodes 183b have a radial shape.

The gate insulating layer 120 is formed on the first base substrate 101 having a gate pattern formed thereon. The gate pattern includes the first gate line GL1, the second gate lines GL2, the first gate electrode GE1, the second electrode GE2, and the third gate electrode GE3. The gate insulating layer 120 covers the gate pattern and the storage line STL.

The active layer 130 is formed on the gate insulating layer 120. The active layer 130 is an electric pathway of the switching element and includes a semiconductor layer having amorphous silicon (s-Si:H) and an ohmic contact layer having amorphous silicon doped with n-type dopants (n+s-Si:H) formed on the semiconductor layer.

A source pattern is formed on the first base substrate 101 having the active layer 130 formed thereon. The source pattern includes the first and the data lines DL1 and DL2, the first to the third source electrodes SE1, SE2 and SE3, and the first to the third drain electrodes DE1, DE2 and DE3. The passivation layer 140 is formed on the first base substrate 101 having the source pattern formed thereon.

The color filter layer 150 is formed on the first base substrate 101 having the passivation layer 140 formed thereon. The color filter layer 150 may be formed on the first sub-pixel area 111 and the second sub-pixel area 112, which are defined by the first gate line GL1, the first data line DL1, the second gate line GL2, and the second data line DL2. The color filter layer 150 may include a first color filter layer, a second color filter layer, and a third color filter layer. The first to third color filter layers represent different colors. For example, the first color filter layer, the second color filter, and the third color filter may represent the colors red, blue, and green, respectively.

The inorganic insulating layer 160 is formed on the first base substrate 101 having the color filter layer 150 formed thereon and may include silicon nitride ($SiN_x$).

The organic insulating pattern 170 is formed on the inorganic insulating layer 160. A first organic insulating pattern is formed on the boundary area between the pixel areas. A second organic insulating pattern is formed on the boundary area between the first sub-pixel area 111 (defined by the first gate line GL1 and the first data line DL1) and the second sub-pixel area 112 (defined by the second gate line GL2 and the second data line DL2). The first organic insulating pattern and the second organic insulating pattern may be referred to as the organic insulating pattern 170 hereinafter. Since the organic insulating layer corresponding to the pixel area is removed, deterioration of the display quality by impurities generated from the organic insulating layer caused by UV exposure may be minimized. Removing the organic insulating layer does not require removal of all traces of the organic insulating layer.

The organic insulating pattern 170 planarizes a surface of the first base substrate 101 having the gate lines GLn, the data lines DLm, and the switching element formed thereon. When a thickness of the organic insulating pattern 170 is reduced on the boundary area between the first sub-pixel area 111 and the second sub-pixel area 112, a stepped portion formed by a blocking pattern disposed between the first and the second pixel areas and the boundary area of the first and second pixel areas is reduced so that a motion blurring of a liquid crystal may be prevented.

The first and second contact holes CNT1 and CNT2 exposing a portion of the first, the second, and the third drain electrodes DE1, DE2 and DE3 are formed through the organic insulating pattern 170. The first and second sub-pixel electrodes PE1 and PE2 are formed on the organic insulating layer 170 having the first and second contact holes CNT1 and CNT2 formed therethrough. The first and second sub-pixel electrodes PE1 and PE2 may include an optically transparent and electrically conductive material and make contact with the first and second drain electrodes DE1 and DE2 through the first and second contact holes CNT1 and CNT2, respectively. The optically transparent and electrically conductive material may include, for example, indium tin oxide (ITO) or indium zinc oxide (IZO).

A first blocking pattern is formed on the boundary area of each pixel area on the first base substrate 101. A second blocking pattern is formed on the boundary area between the first sub-pixel area 111 having the first pixel electrode PE1 and the second sub-pixel area 112 having the second sub-pixel electrodes PE2. The first blocking pattern and the second blocking pattern are referred to as the blocking pattern 190 hereinafter. The blocking pattern 190 may block light that is provided from a lower portion of the first substrate 100 to a liquid crystal layer.

The column spacer 195 is formed on the first substrate 100 for maintaining a cell gap between the first substrate 100 and the second substrate 200. For example, the column spacer 195 is formed on the color filter layer 150 adjacent to an n-th data line. The column spacer 195 is formed from a material identical to the blocking pattern 190.

The second substrate 200 includes a common electrode 210 formed on a second base substrate 201. The common electrode 210 may be formed on the entire surface of the second base substrate 201.

The liquid crystal layer 300 is interposed between the first substrate 100 and the second substrate 200. The liquid crystal layer 300 includes liquid crystal molecules having positive dielectric anisotropy. The liquid crystal molecules may be arranged such that a long axis of the liquid crystal molecules is substantially vertical to surfaces of the first and second substrates 100 and 200 when an electric field is not applied to the liquid crystal layer.

The display panel according to the present exemplary embodiment may include a first alignment layer AL1 (not shown) and a second alignment layer AL2 (not shown) formed on the first substrate 100 and the second substrate 200, respectively.

The first substrate 100 having the first alignment layer AL1 formed thereon may further include a first reactive mesogen layer RML1. The liquid crystal molecules may be pre-tilted by the first reactive mesogen layer RML1 with respect to a vertical direction to the surfaces of the first and second substrates 100 and 200. A reactive mesogen that is a monomer is cured by light to form the first reactive mesogen layer RML1.

The second substrate 200 having the second alignment layer AL2 formed thereon may further include a second reactive mesogen layer RML2. The second alignment layer AL2 and the second reactive mesogen layer RML2 are substantially similar to the first alignment layer AL1 and the first reactive mesogen layer RML1 except that both are formed on the second substrate 200. Accordingly, further description will be omitted.

FIGS. 3A, 3B, 3C, 3D, 3E, 3F, and 3G are cross-sectional views showing a process for forming a first substrate of FIG. 2.

Figure 3A:
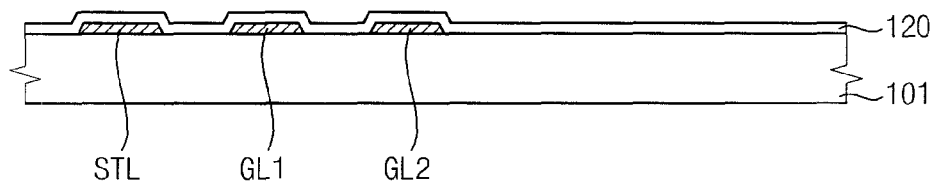
FIGS. 3A, 3B, 3C, 3D, 3E, 3F, and 3G are cross-sectional views showing a process for forming a first substrate of FIG. 2.

Referring to FIGS. 2 and 3A, the gate pattern is formed on the first base substrate 101. A gate metal is deposited on the first base substrate 101 formed from a glass via a sputtering process. The gate metal is etched to form the first and second gate electrodes GE1 and GE2, which are extended from the first and second gate lines GL1 and GL2, respectively. The storage line STL is formed from a layer identical to the first and second gate lines GL1 and GL2 on the first base substrate 101 and is formed from a material identical to the first and the second gate lines GL1 and GL2.

The gate insulating layer 120 is formed on the first base substrate 101 having the gate pattern formed thereon by a process of plasma enhanced chemical vapor deposition (PECVD). For example, the gate insulating layer 120 may include a material such as silicon nitride ($SiN_x$) or silicon oxide ($SiO_x$). The gate insulating layer 120 has a thickness of about 3000 Å.

Figure 3B:
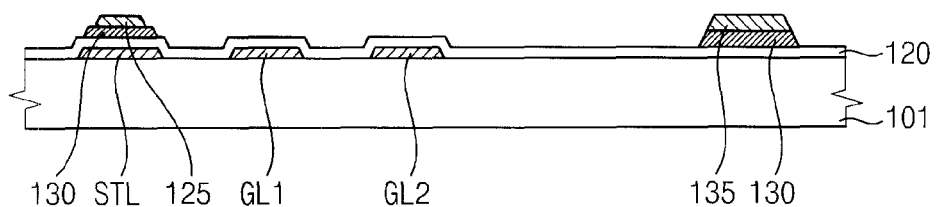

Referring to FIGS. 2 and 3B, the active layer 130 and a source metal layer 135 are sequentially deposited on the first base substrate 101 having the gate insulating layer 120 formed thereon. The active layer 130 includes a semiconductor layer having amorphous silicon (s-Si:H) and an ohmic contact layer having amorphous silicon doped with n-type dopants (n+s-Si:H) formed on the semiconductor layer.

A photoresist pattern is formed on the first base substrate 101 having the source metal layer 135 formed thereon. The photoresist pattern corresponds to the data line DLm, the source electrode, and the drain electrode. The photoresist pattern is used to etch the source metal layer 135 so as to form a source pattern having the data line DLm, the source electrode, and the drain electrode. In addition, a channel of the switching element is formed by an etch-back process.

The passivation layer 140 is formed on the first base substrate 101 having the source pattern formed thereon by a process of PECVD. For example, the passivation layer 140 may include materials such as silicon nitride ($SiN_x$). The passivation layer 140 has a thickness of about 1000 Å.

Figure 3C:
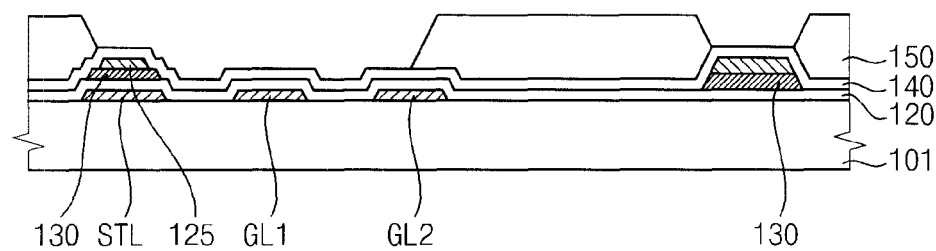

Referring to FIGS. 2 and 3C, the color filter layer 150 is formed on the first base substrate 101 having the passivation layer 140 formed thereon. The color filter layer 150 is formed corresponding to the pixel area. The color filter layer 150 may include a first color filter layer, a second color filter layer, and a third color filter layer. The first color filter layer, the second color filter, and the third color filter layer represent different colors. For example, the first color filter layer, the second color filter layer, and the third color filter layer represent the colors red, blue, and green, respectively. The first, the second, and the third color filter layers may be disposed on each of the pixel areas in order along a first direction.

The inorganic insulating layer 160 is formed on the first base substrate 101 having the color filter layer 150. The inorganic insulating layer 160 may include a material such as silicon nitride ($SiN_x$) and has a thickness of about 700 Å.

Figure 3D:
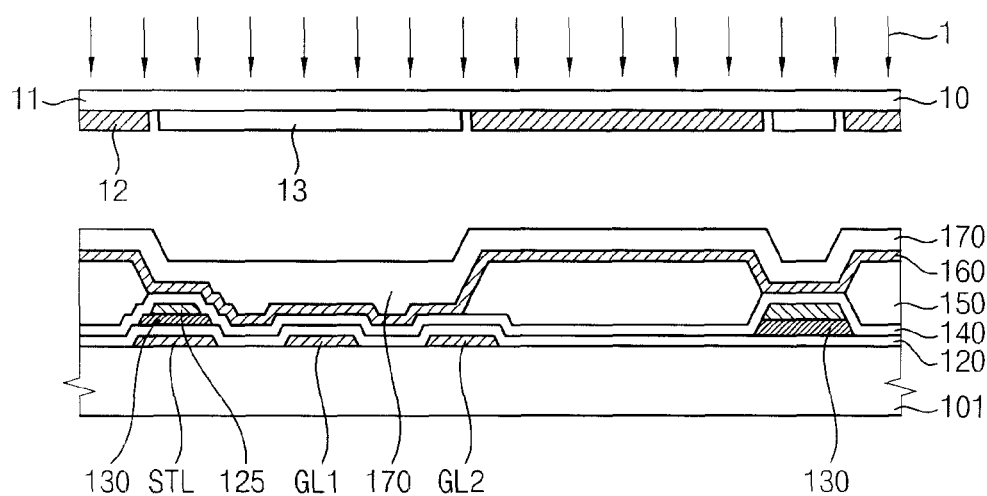

Referring to FIGS. 2 and 3D, the organic insulating layer 170 is formed on the first base substrate 101 having the inorganic insulating layer 160 formed thereon. The organic insulating layer 170 includes an organic material having a negative photoresist composed of, for example, an acrylic or a polyimide compound or composition.

A mask 10 is disposed to expose the organic insulating layer 170. The mask 10 includes a transparent substrate 11, a blocking part 12, and a half-transmitting part 13. The transparent substrate 11 transmits light includes a transparent material, for example, quartz. The blocking part 12 includes a metal material, for example, chromium.

The blocking part 12 corresponds to the pixel area. The half-transmitting part 13 corresponds to the boundary area of the pixel areas. In addition, the half-transmitting part 13 corresponds to the boundary area of the sub-pixel areas.

Ultraviolet (UV) light 1 irradiates the mask 10 to partially cure the organic insulating layer 170 corresponding to the half-transmitting part 13 so that a partial thickness of the organic insulating layer 170 remains. The organic insulating layer 170 corresponding to the blocking part 12 is not cured but is removed to form the organic insulating pattern, but removing the organic insulating layer does not require removal of all traces of the organic insulating layer.

The first, the second, and the third contact holes CNT1, CNT2, and CNT3 are formed through the passivation layer 140, the inorganic insulating layer 160, and the organic insulating pattern 170 corresponding to a pixel unit. The first and second contact holes CNT1 and CNT2 expose a portion of the first and second drain electrodes DE1 and DE2. The third contact hole CNT3 exposes a portion of the storage line STL. The first and second contact holes CNT1 and CNT2 electrically contact with the first, the second, and the third drain electrodes DE1, DE2, and DE3 in which are input terminals of the first, the second, and the third switching elements SW1, SW2, and SW3, respectively.

Alternatively, the organic insulating layer 170 may be patterned by a dry-etching process, and may be removed by a slit mask.

Figure 3E:
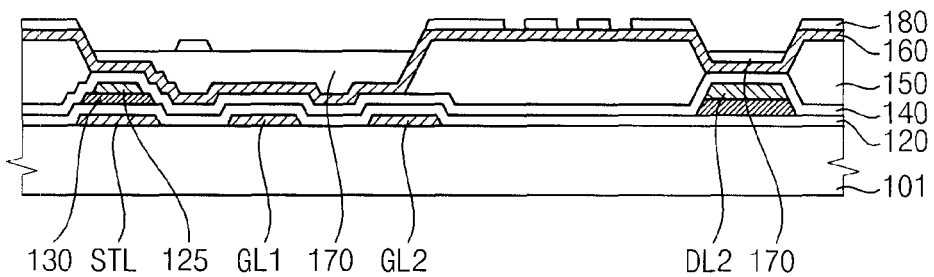

Referring to FIGS. 2 and 3E, the pixel electrode 180 corresponding to the each of pixel units is formed on the first base substrate 101 having the organic insulating pattern 170 having the first, the second, and the third contact holes CNT1, CNT2, and CNT3 formed therethrough. The pixel electrode 180 is formed from an optically transparent and electrically conductive material. The pixel electrode 180 contacts the first and second drain electrodes DE1 and DE2 through the first and second contact holes CNT1 and CNT2. The pixel electrode 180 contacts the storage line STL through the third contact hole CNT3. The optically transparent and electrically conductive material includes, for example, indium tin oxide (ITO) and indium zinc oxide (IZO).

Figure 3F:
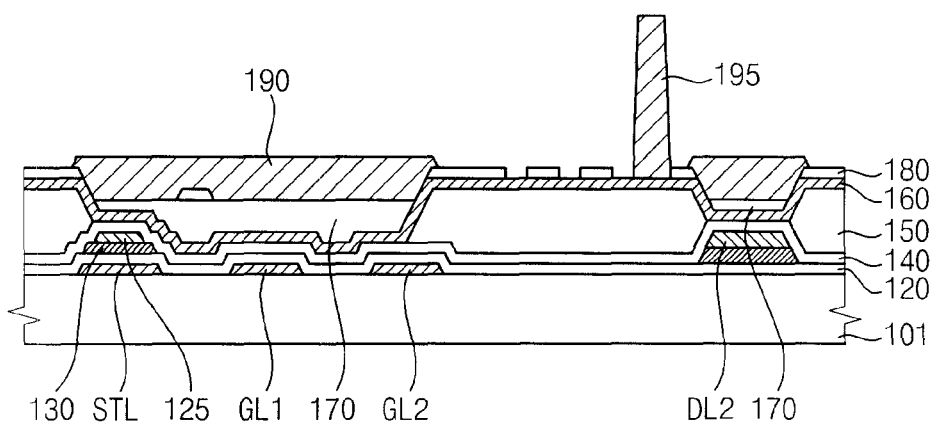

Referring to FIGS. 2 and 3F, the blocking pattern 190 and the column spacer 195 are formed on the first base substrate 101 having the pixel electrode 180 formed thereon. The blocking pattern 190 is formed on the boundary area between adjacent pixel areas. The column spacer 195 is formed on the color filter layer 150 adjacent to an n-th data line. The blocking pattern 190 and the column spacer 195 are simultaneously formed by using a same mask.

Figure 3G:
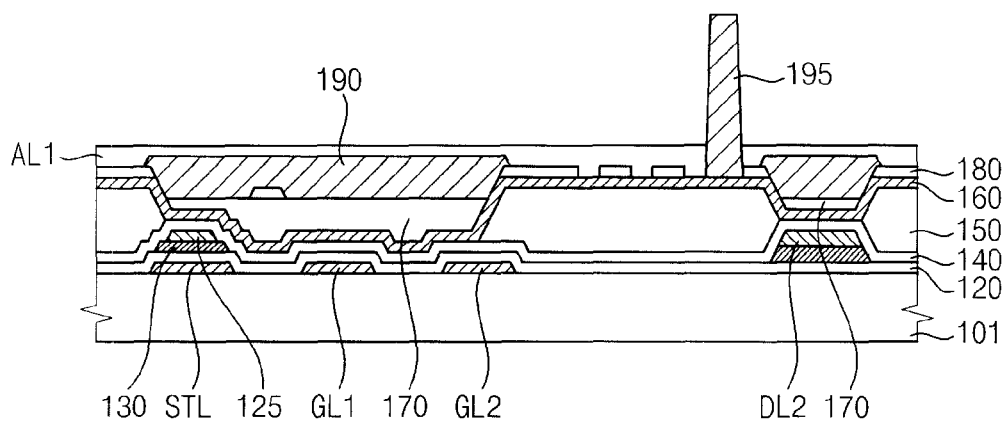

Referring to FIGS. 3 and 3G, the first base substrate 101 may include the first alignment layer AL1 formed on the pixel electrode 180. The first alignment layer AL1 arranges the liquid crystal composition of the liquid crystal layer 300 in a vertical direction with respect to the first base substrate 101. For example, the first alignment layer AL1 may include polyimide material.

Figure 4:
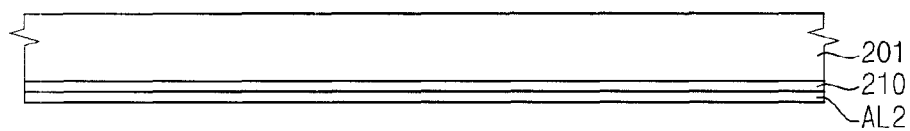
FIG. 4 is a cross-sectional view showing a process for forming a second substrate of FIG. 2.

FIG. 4 is a cross-sectional view showing a process for forming a second substrate of FIG. 2.

Referring to FIG. 4, the second substrate 200 includes the common electrode 210 formed on the second base substrate 201. The common electrode 210 may be formed on the entire surface of the second base substrate 201.

The second base substrate 201 may include the second alignment layer AL2 disposed on the common electrode 210. The second alignment layer AL2 opposes the first alignment layer AL1 and arranges the liquid crystal composition in the vertical direction relative to the surface of the second substrate 200.

Figure 5A:
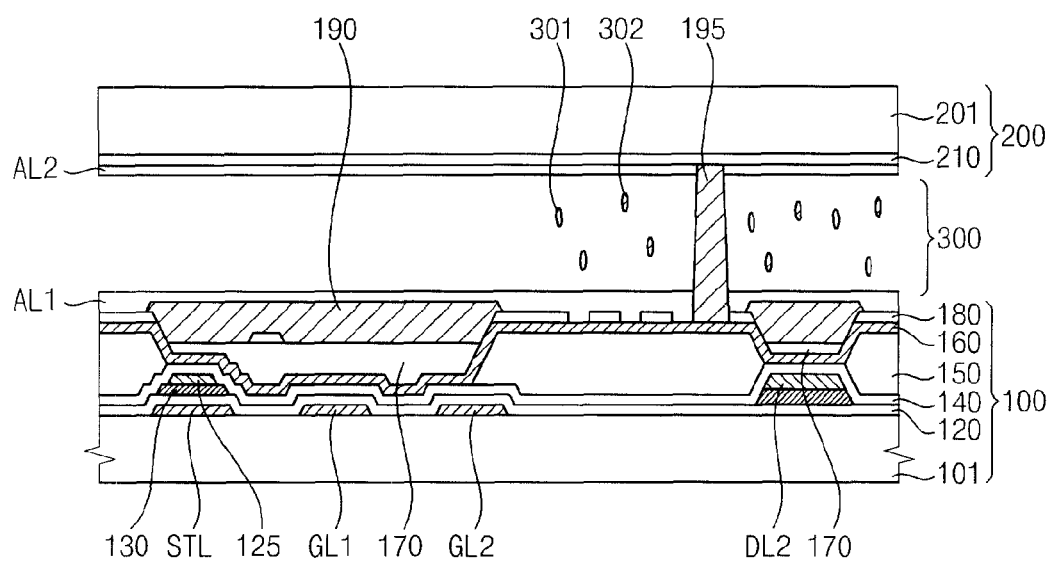
FIGS. 5A, 5B, and 5C are cross-sectional views showing a process for forming the display panel of FIG. 2.
Figure 5B:
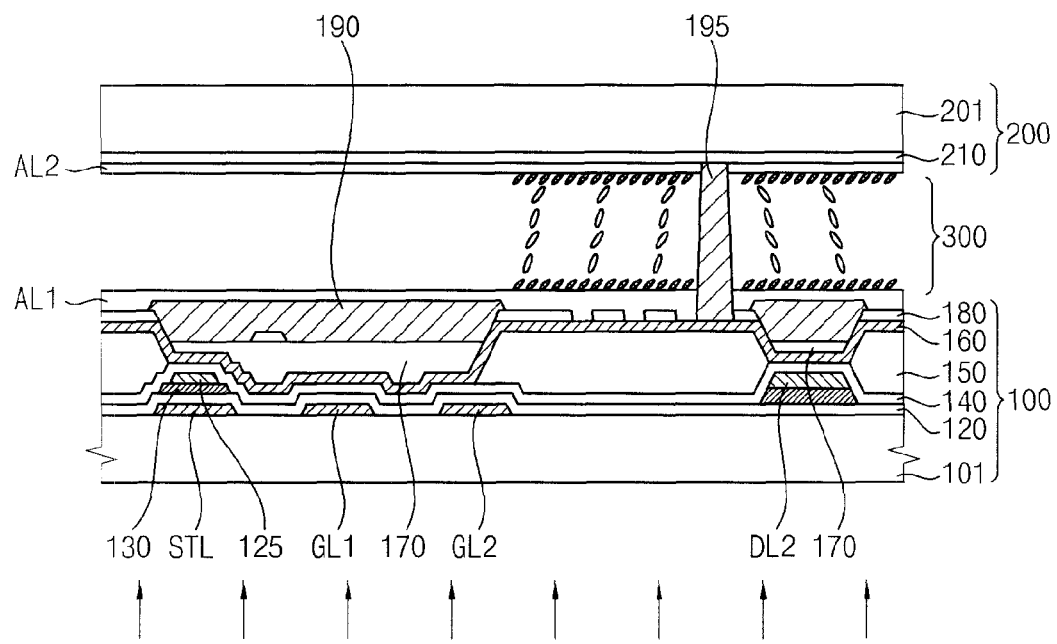
Figure 5C:
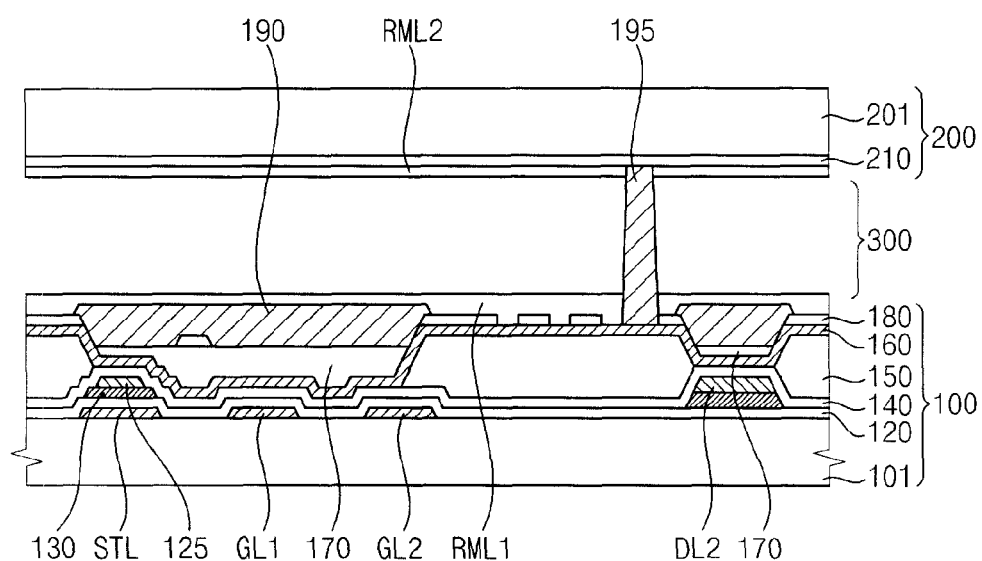

FIGS. 5A, 5B and 5C are cross-sectional views showing a process for forming the display panel of FIG. 2.

Referring to FIG. 5A, the first substrate 100 and the second substrate 200 are combined to face to each other. The liquid crystal composition is interposed between the first and second substrates 100 and 200 to form the liquid crystal layer 300. Alternatively, the liquid crystal composition may be dropped on the first substrate 100, and the first substrate 100 and the second substrate 200 combined to interpose the liquid crystal layer 300 therebetween.

The liquid crystal composition of the display panel according to the present exemplary embodiment may further include a reactive mesogen 302. Examples of the reactive mesogen 302 is disclosed by U.S. Patent Application Publication No. 2008/0266503 A1, the contents of which are hereby incorporated by reference. The reactive mesogen 302 may include at least one compound selected from the group consisting of the following chemical formulae I, II, III, and IV shown below.

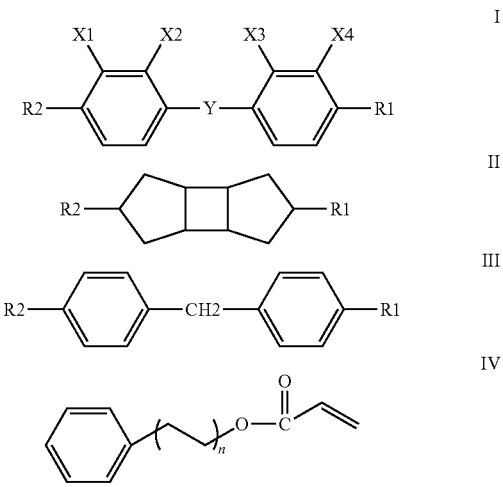

wherein $R_1$ and $R_2$ independently represent an acrylate group, a vinyl group, or an epoxy group; Y represents —$(CH_2)$—, —O—, —CO—, —$C(CF_3)_2$—, or a single bond; $X_1$, $X_2$, $X_3$, and $X_4$ independently represent H or F; and n represents an integer ranging from 0 to 2.

The liquid crystal composition may range from about 0.05% by weight to about 0.5% by weight of the reactive mesogen 302 based on a total weight of the liquid crystal composition. When the content of the reactive mesogen 302 is less than about 0.05% by weight, the reactive mesogen layer may not be formed adjacent to the alignment layer of the display panel. When the content of the reactive mesogen 302 is greater than about 0.5% by weight, the reactive mesogen 302 may be cured by light applied from a backlight assembly (not shown) or by external light so that a residual image may be created. Therefore, the liquid crystal composition may range from about 0.05% by weight to about 0.5% by weight of the reactive mesogen 302 based on a total weight of the liquid crystal composition.

Referring to FIG. 5B, when a voltage is applied between the first substrate 100 and the second substrate 200 to form an electric field, the liquid crystal molecules 301 and the reactive mesogen 302 tilt with respect to the direction normal to the surfaces of the first substrate 100 and the second substrate 200. Light irradiates the first substrate 100 and the second substrate 200 while a voltage is applied, establishing an electric field therebetween. The light may be UV wavelengths. The reactive mesogen 302 is photopolymerized to be cured. The light intensity may range from about 3 J/cm$^2$ to about 10 J/cm$^2$ of unpolarized UV radiation. When the light irradiates the liquid crystal layer 300, the liquid crystal molecules 301 may have a pretilt angle due to the electric field. Light may continue to irradiate the liquid crystal layer 300 after voltage is no longer applied to the first substrate 100 and the second substrates 200. Therefore, residual reactive mesogen is transformed to reduce the amount of reactive mesogen remaining in the liquid crystal layer 300. For this, the intensity of unpolarized UV may range from about 20 J/cm$^2$ to about 60 J/cm$^2$.

Referring to FIG. 5C, the first reactive mesogen layer RML1 is formed on the first substrate 100, and the second reactive mesogen layer RML2 is formed on the second substrate 200 after irradiating the light. The first reactive mesogen layer RML1 is formed on the first alignment layer AL1. The second reactive mesogen layer RML2 is formed on the second alignment layer AL2. The liquid crystal molecules 301 are pre-tilted by the first and second reactive mesogen layers RML1 and RML2. Therefore, the liquid crystal molecules 310 may obtain a pretilt angle by the first and second reactive mesogen layers RML1 and RML2 while an electric field is not applied.

According to the present exemplary embodiment, the organic insulating layer corresponding to the pixel area is removed, and a height of the organic insulating layer corresponding to the boundary area between the pixel areas is reduced. Therefore, deterioration of display quality by impurities generated from the organic insulating layer may be minimized, and a stepped portion of a blocking pattern disposed between the pixel area and the boundary area of the pixel area is reduced, preventing motion blurring of a liquid crystal. Removal of the organic insulating layer does not require complete removal of the organic insulating layer.

Figure 6:
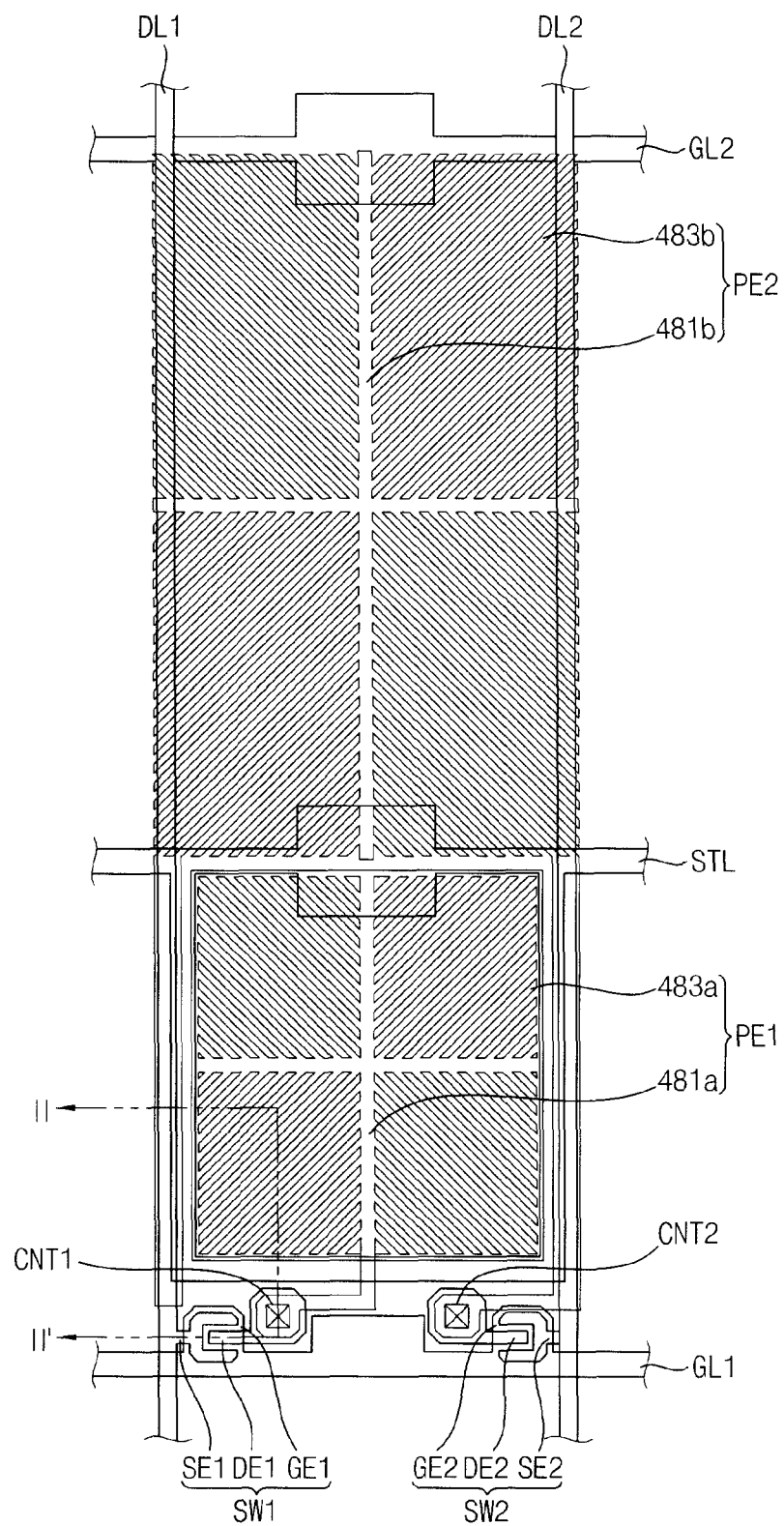
FIG. 6 is a plan view showing a display panel according to another exemplary embodiment of the present invention.
Figure 7:
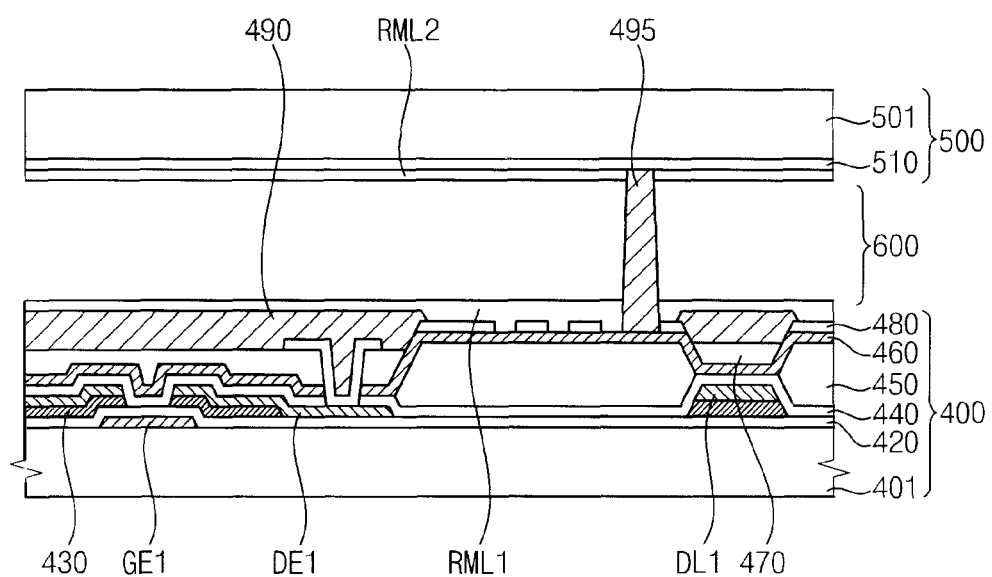
FIG. 7 is a cross-sectional view taken along a line II-IF of the display panel of FIG. 6.

FIG. 6 is a plan view showing a display panel according to another exemplary embodiment of the present invention. FIG. 7 is a cross-sectional view taken along a line II-II' of the display panel of FIG. 6.

The display panel according to the present exemplary embodiment is substantially similar to the display panel of the previous exemplary embodiment except that a boundary area is not formed between the first sub-pixel electrode PE1 and the second sub-pixel electrode PE2, and the display panel is driven by the first switching element SW1 and the second switching element SW2. Accordingly, the same reference numerals will be used to refer to the same elements as those described above, and a detailed explanation will be omitted.

The display panel according to the present exemplary embodiment includes a first substrate 400, a second substrate 500, and a liquid crystal layer 600.

The first substrate 400 includes a gate line GLn, a data line DLm, a storage line STL, a first switching element SW1, a second switching element SW2, a gate insulating layer 420, an active layer 430, a passivation layer 440, a color filter layer 450, an inorganic insulating layer 460, an organic insulating pattern 470, a pixel electrode, a blocking pattern 490, and a column spacer 495; all are formed on the first base substrate 401. The switching element includes the first switching element SW1 and the second switching element SW2. The pixel electrode includes the first sub-pixel electrode PE1 and the second sub-pixel electrode PE2.

The first switching element SW1 is adjacent to an area where the first gate line GL1 and the first data line DL1 cross. The first gate electrode GE1 of the first switching element SW1 is connected to the first gate line GL1. The first source electrode SE1 is connected to the first data line DL1. The first pixel electrode PE1 is electrically connected to the first drain electrode DE1 through the first contact hole CNT1.

The second switching elements SW2 is adjacent to an area where the first gate line GL1 and the first data line DL1 cross. The second gate electrode GE2 is connected to the first gate line GL1. The second source electrode SE2 of the second switching element SW2 is connected to the second data line DL2. The second drain electrode DE2 is electrically connected to the second sub-pixel electrode PE2 through the second contact hole CNT2.

The first switching element SW1 and the second switching element SW2 are turned on in response to a first gate signal applied to the first gate line GL1. An area having the first sub-pixel electrode PE1 may be defined as a high pixel of the display panel. An area having the second sub-pixel electrode PE2 may be defined as a low pixel of the display panel.

The second substrate 500 includes the common electrode 510 formed on the second base substrate 501. The common electrode 510 may be formed on the entire surface of the second base substrate 501.

The liquid crystal layer 600 is interposed between the first substrate 400 and the second substrate 500. The liquid crystal layer 600 includes liquid crystal molecules having a positive dielectric anisotropy. The liquid crystal molecules may be arranged such that the long axis of the liquid crystal molecules is substantially vertical to the surfaces of the first substrate 400 and the second substrate 500 when an electric field is not applied to the liquid crystal layer.

Figure 8A:
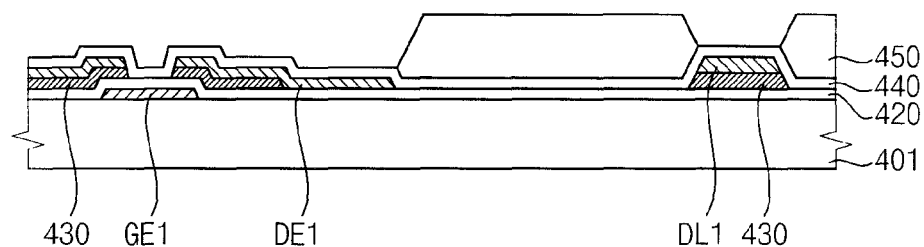
FIGS. 8A, 8B, and 8C are cross-sectional views showing a process for forming a first substrate of FIG. 7.
Figure 8B:
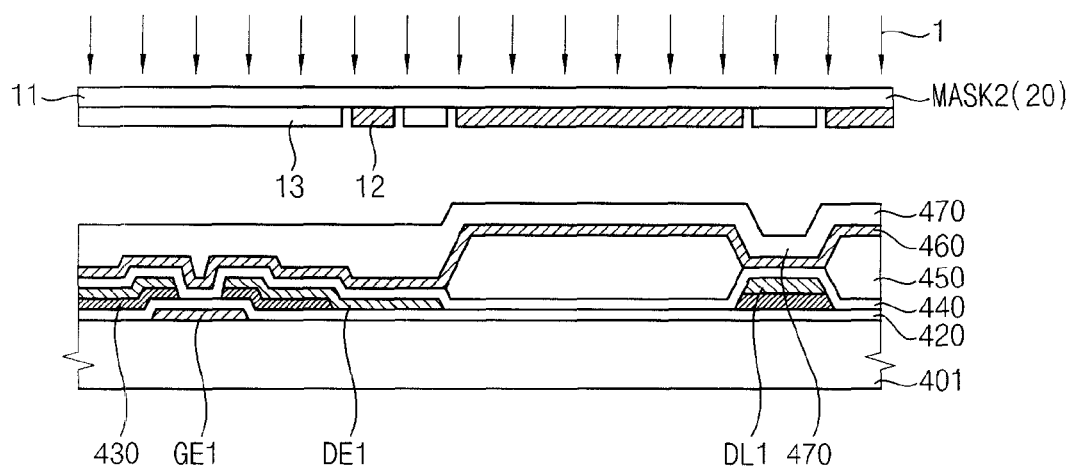
Figure 8C:
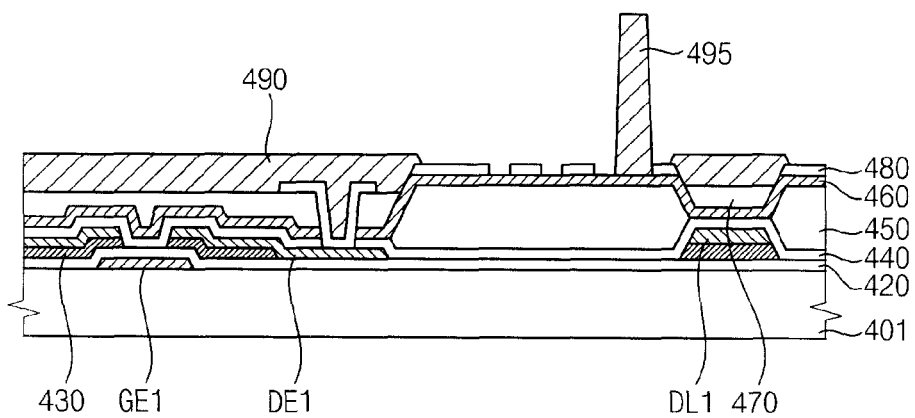

FIGS. 8A, 8B, and 8C are cross-sectional views showing a process for forming a first substrate of FIG. 7.

Referring to FIG. 8A, the gate pattern having the gate electrode GE1 and the gate line, the gate insulating layer 420, the active layer 430, and the source pattern having the source electrode and the first drain electrode DE1 are sequentially deposited on the first base substrate 401 to form the first switching element SW1. The passivation layer 440 is formed on the first base substrate 401 having the first switching element SW1 formed thereon. The color filter layer 450 corresponding to the pixel area is formed on the first base substrate 401 having the passivation layer 440 formed thereon.

Referring to FIG. 8B, the inorganic insulating layer 460 and the organic insulating layer 470 are sequentially formed on the first base substrate 401 having the color filter layer 450 formed thereon. The organic insulating layer 470 corresponding to the pixel area is removed by, for example, UV exposure 1, and the organic insulating layer 470 corresponding to the boundary area of the pixel area is partially removed by UV exposure 1 to form the organic insulating pattern 470. Removing the organic insulating layer does not require complete removal, and some residue of the organic insulating layer may remain. The first contact hole CNT1 is formed through the organic insulating pattern 470. The pixel electrode 480 is electrically connected to the drain electrode DE1 through the first contact hole CNT1.

Referring to FIG. 8C, the pixel electrode 480 is formed on the first base substrate 401 having the organic insulating pattern 470 formed thereon. The blocking pattern 490 and the column spacer 495 are simultaneously formed on the first base substrate 401 having the pixel electrode 480 by using a same mask. The process forming the second substrate 500 and the liquid crystal layer 600 of the display panel in this embodiment is substantially similar to the process forming the display panel according to the previous exemplary embodiment. Accordingly, a detailed explanation will be omitted.

According to the present exemplary embodiment, the organic insulating layer corresponding to the pixel area is removed, and a height of the organic insulating layer corresponding to the boundary area between the pixel areas is reduced. Therefore, deterioration of display quality by impurities generated from the organic insulating layer may be minimized, and a stepped portion of a blocking pattern disposed between the pixel area and the boundary area of the pixel area is reduced so that motion blurring of a liquid crystal may be prevented.

Figure 9:
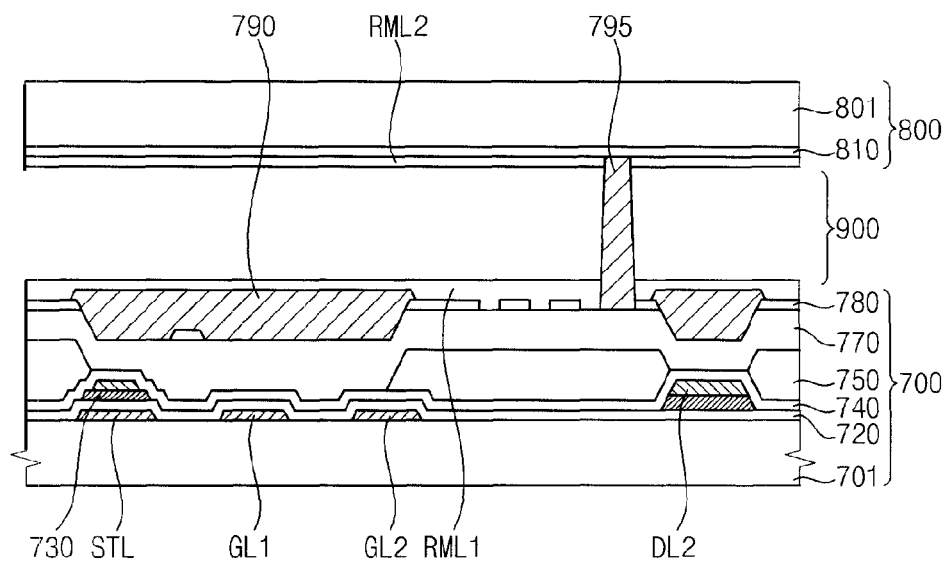
FIG. 9 is a cross-sectional view showing a display panel according to another exemplary embodiment of the present invention.

FIG. 9 is a cross-sectional view showing a display panel according to another exemplary embodiment of the present invention.

The display panel according to the present exemplary embodiment is substantially similar to the display panel described in FIG. 1 except that the organic insulating layer is formed on the entire surface of the display substrate, and the inorganic insulating layer is not formed on the color filter layer so a detailed explanation will be omitted.

The display panel according to the present exemplary embodiment includes the first substrate 700, the second substrate 800 and the liquid crystal layer 900.

The first substrate 700 includes the gate line GLn, the data line DLm, the storage line STL, the first switching element SW1, the second switching element SW2, the third switching element SW3, the gate insulating layer 720, the active layer 730, the passivation layer 740, the color filter layer 750, the organic insulating layer 770, the pixel electrode, the blocking pattern 790, the column spacer 795, and the first reactive mesogen layer RML1, all of which are formed on the first base substrate 701.

Referring to FIG. 9, the organic insulating layer 770 is formed on the entire surface of the first base substrate 701 having the switching element and the color filter layer 750. The organic insulating layer 770 includes silicon nitride ($SiN_x$). The pixel electrode 780, the blocking pattern 790, and the column spacer 795 are formed by a process identical to a process for forming the display panel described in FIG. 1.

The second substrate 800 includes the common electrode 810 and the second reactive mesogen layer RML2 formed on the second base substrate 801. The common electrode 810 may be formed on the entire surface of the second base substrate 801.

The liquid crystal layer 900 is interposed between the first substrate 700 and the second substrate 800. The liquid crystal composition may be dropped on the first substrate 700, and the first substrate 700 and the second substrate 800 combined to interpose the liquid crystal layer 900 therebetween.

The liquid crystal composition of the display panel according to the present exemplary embodiment may include a reactive mesogen having at least one compound selected from the group consisting of compounds represented by the chemical formulae I, II, III, and IV. The liquid crystal composition may range from about 0.05% by weight to about 0.5% by weight of the reactive mesogen based on a total weight of the liquid crystal composition.

Figure 10A:
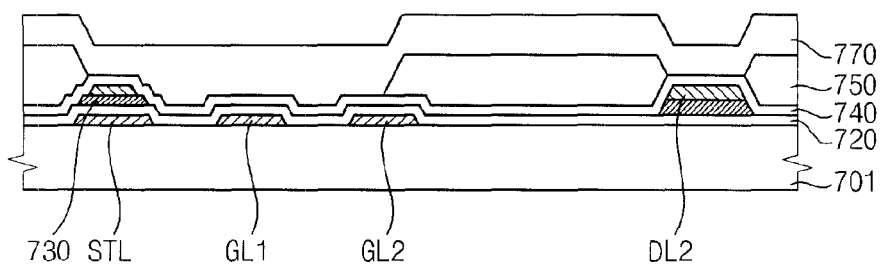
FIGS. 10A and 10B are cross-sectional views showing a process for forming a first substrate of FIG. 9.
Figure 10B:
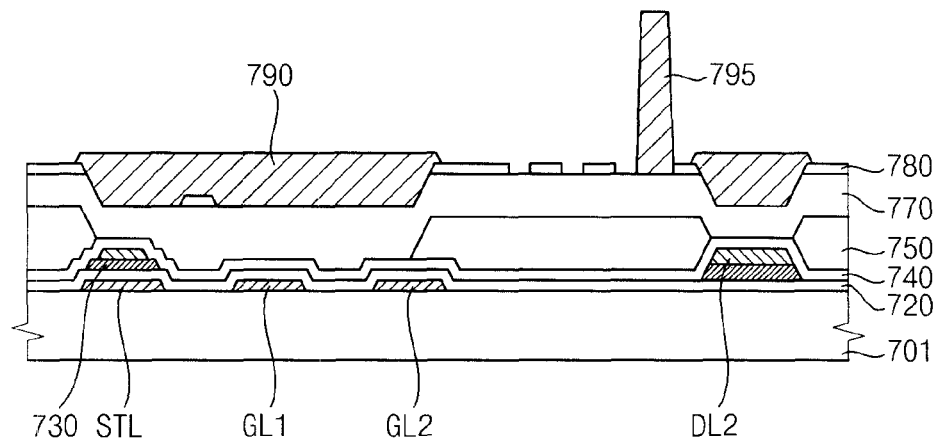

FIGS. 10A and 10B are cross-sectional views showing a process for forming a first substrate of FIG. 9.

Referring to FIG. 10A, the gate pattern having the first gate electrode GE1 and the first gate line GL1, the gate insulating layer 720, the active layer 730, and the source pattern having the first source electrode SE1 and the first drain electrode DE1, the passivation layer 740, the color filter layer 750, and the organic insulating layer 770 are sequentially formed on the first base substrate 701.

Referring to FIG. 10B, the contact hole (not shown) is formed through the organic insulating layer 770. The pixel electrode 780 is formed on the organic insulating layer 770 having the contact hole formed therethrough. The blocking pattern 790 and the column spacer 795 are simultaneously formed on the first base substrate 701 having the pixel electrode 780 by using a same mask.

The process forming the second substrate 800 and the liquid crystal layer 900 of the display panel in the present exemplary embodiment is substantially similar to the process for forming the display panel described in FIG. 1 so a detailed explanation will be omitted.

Figure 11:
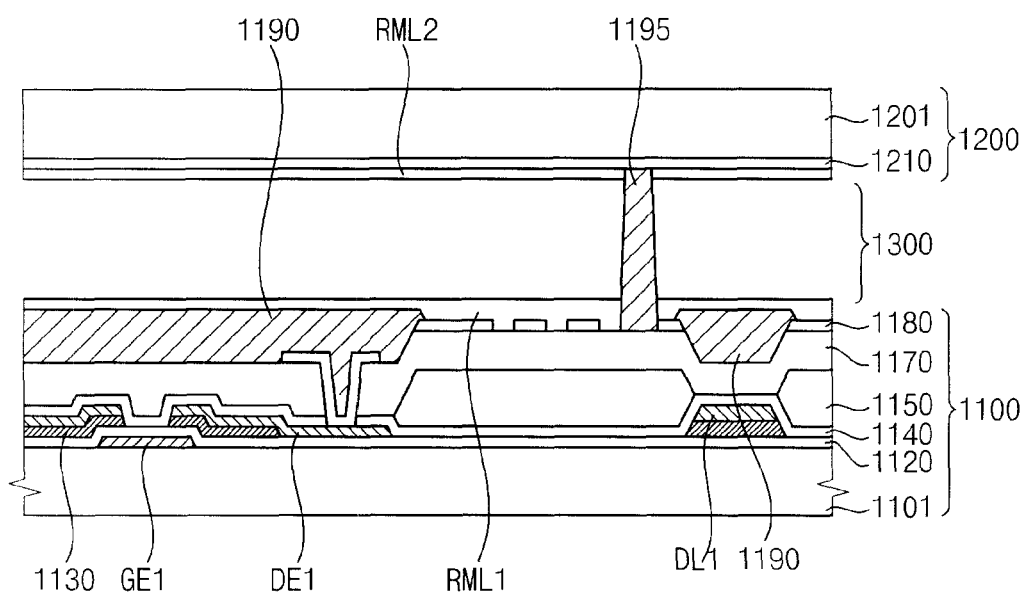
FIG. 11 is a cross-sectional view showing a display panel according to another exemplary embodiment of the present invention.

FIG. 11 is a cross-sectional view illustrating a display panel according to another exemplary embodiment of the present invention.

The display panel according to the present exemplary embodiment is substantially similar to the display panel described in FIG. 6 except that the organic insulating layer is formed on the entire surface of the display substrate, and the inorganic insulating layer is not formed on the color filter layer.

The display panel according to the present exemplary embodiment includes the first substrate 1100, the second substrate 1200, and the liquid crystal layer 1300.

The first substrate 1100 includes the gate line GLn, the data line DLm, the storage line STL, the first switching element SW1, the second switching element SW2, the gate insulating layer 1120, the active layer 1130, the passivation layer 1140, the color filter layer 1150, the organic insulating layer 1170, the pixel electrode, the blocking pattern 1190, the column spacer 1195, and the first reactive mesogen layer RML1; all are formed on the first base substrate 1101.

Referring to FIG. 11, the organic insulating layer 1170 is formed on the entire surface of the first base substrate 1101 having the switching element SW and the color filter layer 1150. The organic insulating layer 1170 may include materials such as silicon nitride ($SiN_x$). The pixel electrode 1180, the blocking pattern 1190, and the column spacer 1195 are formed by a process identical to the process for forming the display panel described in FIG. 6.

The second substrate 1200 includes the common electrode 1210 formed on the second base substrate 1201. The common electrode 1210 may be formed on the entire surface of the second base substrate 1201.

The liquid crystal layer 1300 is interposed between the first substrate 1100 and the second substrate 1200. The liquid crystal composition may be dropped on the first substrate 1100, and the first substrate 1100 and the second substrate 1200 are combined to form the liquid crystal layer 1300.

The liquid crystal composition of the display panel according to the present exemplary embodiment may include a reactive mesogen having at least one compound selected from the group consisting of compounds represented by the chemical formulae I, II, III, and IV. The liquid crystal composition may range from about 0.05% by weight to about 0.5% by weight of the reactive mesogen based on a total weight of the liquid crystal composition.

Figure 12A:
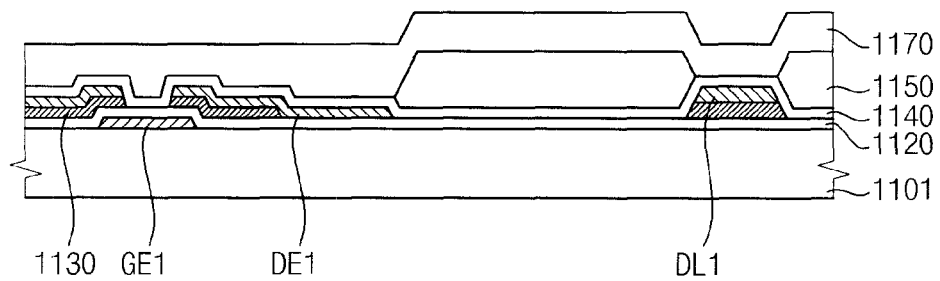
FIGS. 12A and 12B are cross-sectional views showing a process for forming a first substrate of FIG. 11.
Figure 12B:
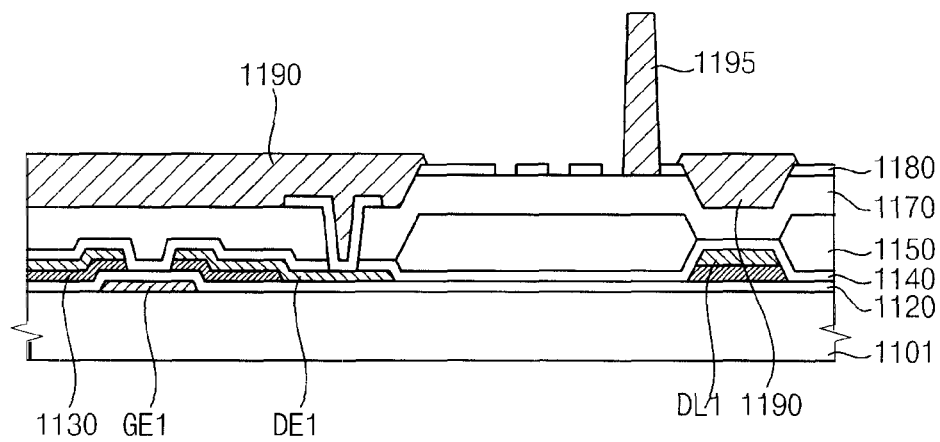

FIGS. 12A and 12B are cross-sectional views showing a process for forming a first substrate of FIG. 11.

Referring to FIG. 12A, the gate pattern having the first gate electrode GE1 and the gate line, the gate insulating layer 1120, the active layer 1130, and the source pattern having the source electrode and the first drain electrode DE1 are sequentially formed on the first base substrate 1101 to form the first switching element SW1. The passivation layer 1140, the color filter layer 1150, and the organic insulating layer 1170 are sequentially formed on the first base substrate 1101 having the first switching element SW1.

Referring to FIG. 12B, the first contact hole is formed through the organic insulating layer 1170. The pixel electrode 1180 is formed on the organic insulating layer 1170 having the first contact hole CNT1 formed therethrough. The blocking pattern 1190 and the column spacer 1195 are simultaneously formed on the first base substrate 1101 having the pixel electrode 1180 by using a same mask.

The process forming the second substrate 1200 and the liquid crystal layer 1300 of the display panel in this embodiment is substantially similar to the process for forming the display panel described in FIG. 6. Accordingly, any detailed explanation will be omitted.

According to exemplary embodiments of the present invention, an organic insulating layer corresponding to the pixel area is removed (but not necessarily totally removed) so that deterioration of display quality by impurities generated from the organic insulating layer may be minimized. In addition, a stepped portion of a blocking pattern disposed between a pixel area and a boundary area of a plurality of the pixel areas is reduced so that motion blurring of a liquid crystal may be prevented.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display substrate, comprising:
    a color filter layer disposed on a substrate and within a pixel area;
    a first organic insulating pattern disposed on the substrate in a position corresponding to a first boundary area between adjacent pixel areas;
    a pixel electrode disposed on the color filter layer;
    a first blocking pattern disposed on the first organic insulating pattern; and
    an inorganic insulating layer disposed between the color filter layer and the pixel electrode,
    wherein the inorganic insulating layer is further disposed between the first organic insulating pattern and the substrate.

2. The display substrate of claim 1, further comprising a column spacer disposed on the substrate to maintain a cell gap, the column spacer comprising a material identical to a material of the first blocking pattern.

3. The display substrate of claim 1, wherein the pixel electrode comprises a first sub-pixel electrode disposed in a first sub-pixel area of the pixel area and a second sub-pixel electrode disposed in a second sub-pixel area of the pixel area.

4. The display substrate of claim 3, further comprising:
    a first switching element electrically connected to the first sub-pixel electrode; and
    a second switching element electrically connected to the second sub-pixel electrode,
    wherein the first switching element and the second switching element are disposed in a second boundary area located between the first sub-pixel electrode and the second sub-pixel electrode.

5. The display substrate of claim 4, further comprising:
    a second organic insulating pattern disposed in the second boundary area; and
    a second blocking pattern disposed on the second organic insulating pattern.

6. The display substrate of claim 5, wherein the inorganic insulating layer is disposed between the second organic insulating pattern and the substrate.

7. The display substrate of claim 1, further comprising a reactive mesogen layer disposed on the pixel electrode, a reactive mesogen of the reactive mesogen layer arranged at a pretilt angle.

8. A display substrate, comprising:
    a color filter layer disposed on a substrate and within a pixel area;
    a first organic insulating pattern disposed on the substrate in a position corresponding to a first boundary area between adjacent pixel areas;
    a pixel electrode disposed on the color filter layer;
    a first blocking pattern disposed on the first organic insulating pattern; and
    an inorganic insulating layer disposed between the first organic insulating pattern and the substrate,
    wherein the inorganic insulating layer is disposed between the color filter layer and the pixel electrode.

9. The display substrate of claim 8, further comprising a column spacer disposed on the substrate to maintain a cell gap, the column spacer comprising a material identical to a material of the first blocking pattern.

10. The display substrate of claim 8, wherein the pixel electrode comprises a first sub-pixel electrode disposed in a first sub-pixel area of the pixel area and a second sub-pixel electrode disposed in a second sub-pixel area of the pixel area.

11. The display substrate of claim 10, further comprising:
    a first switching element electrically connected to the first sub-pixel electrode; and
    a second switching element electrically connected to the second sub-pixel electrode,
    wherein the first switching element and the second switching element are disposed in a second boundary area located between the first sub-pixel electrode and the second sub-pixel electrode.

12. The display substrate of claim 11, further comprising:
    a second organic insulating pattern disposed in the second boundary area; and
    a second blocking pattern disposed on the second organic insulating pattern.

13. The display substrate of claim 12, wherein the inorganic insulating layer is disposed between the second organic insulating pattern and the substrate.

14. The display substrate of claim 8, further comprising a reactive mesogen layer disposed on the pixel electrode, a reactive mesogen of the reactive mesogen layer arranged at a pretilt angle.

15. A display substrate, comprising:
    a color filter layer disposed on a substrate and within a pixel area;
    a first organic insulating pattern disposed on the substrate in a position corresponding to a first boundary area between adjacent pixel areas;
    a pixel electrode disposed on the color filter layer;
    a first blocking pattern disposed on the first organic insulating pattern; and
    an inorganic insulating layer disposed between the first organic insulating pattern and the substrate,
    wherein the first organic insulating pattern is disposed on the inorganic insulating layer, and the color filter layer is disposed under the inorganic insulating layer.

16. The display substrate of claim 15, wherein the inorganic insulating layer comprises silicon nitride.

17. The display substrate of claim 15, further comprising a column spacer disposed on the substrate to maintain a cell gap, the column spacer comprising a material identical to a material of the first blocking pattern.

* * * * *